(12) United States Patent
Watts (10) Patent No.: US 6,198,668 B1
(45) Date of Patent: Mar. 6, 2001

(54) MEMORY CELL ARRAY FOR PERFORMING A COMPARISON

(75) Inventor: Lloyd Watts, Mountain View, CA (US)

(73) Assignee: Interval Research Corporation, Palo Alto, CA (US)

( * ) Notice: Subject to any disclaimer, the term of this patent is extended or adjusted under 35 U.S.C. 154(b) by 0 days.

(21) Appl. No.: 09/356,485

(22) Filed: Jul. 19, 1999

(51) Int. Cl.[7] .................. G11C 7/00; G05B 1/00
(52) U.S. Cl. .................. 365/189.07; 340/146.2; 364/715.06
(58) Field of Search .................. 365/189.07, 189.08; 340/146.2; 364/715.06

(56) References Cited

U.S. PATENT DOCUMENTS

| | | | |
|---|---|---|---|
| 5,003,286 | * 3/1991 | Carbonaro et al. | 340/146.2 |
| 5,134,384 | * 7/1992 | Kokubun | 340/146.2 |
| 5,166,660 | * 11/1992 | Peterson et al. | 340/146.2 |

* cited by examiner

*Primary Examiner*—Son Mai
(74) *Attorney, Agent, or Firm*—Ritter, VanPelt & Yi (57) ABSTRACT

A memory cell having a memory cell state is disclosed. The memory cell state includes a memory unit configured to store a bit of data wherein the bit of data determines whether the memory cell state is a first state or a second state and a common state indicator line configured to indicate a common state associated with a group of memory cells. The memory cell state further comprises a logic circuit configured to compare the memory cell state to the common state and an output line is configured to indicate the result of the comparison. A method of identifying one or more minimum value elements in a set of elements is also disclosed. The method includes storing the values in a memory cell array having a plurality of sets of memory cells, each value being stored in a set of memory cells. The stored values are compared to a set of common state indicator lines configured to indicate the minimum value stored in the memory cell array. The method further includes noting which sets of memory cells store the minimum value.

19 Claims, 8 Drawing Sheets

| Input | | | Output | |
|---|---|---|---|---|
| Bit | Common State Indicator | Enable Input | Output | Common State Indicator |
| 1 | 0 | 1 | 0 | X |
| 1 | 1 | 1 | 1 | X |
| 1 | 0 | 0 | 0 | X |
| 1 | 1 | 0 | 0 | X |
| 0 | 0 | 1 | 1 | 0 |
| 0 | 1 | 1 | — | |
| 0 | 0 | 0 | 0 | X |
| 0 | 1 | 0 | 0 | X |

MEMORY CELL ARRAY FOR PERFORMING A COMPARISON

FIELD OF THE INVENTION

The present invention relates generally to a memory cell array. More specifically, a memory cell array is disclosed that determines the minimum value of data stored in elements of the array and also determines the place in the array where the minimum value is stored without requiring sequential accessing of the elements of the array for comparing of the stored values.

BACKGROUND OF THE INVENTION

It is required in certain processes to determine which value in a set of values is the minimum value or the maximum value in the set. In most applications, it is sufficient to access each of the values in a stored set of data and to compare the values to each other to determine the minimum and maximum values.

Figure 1:
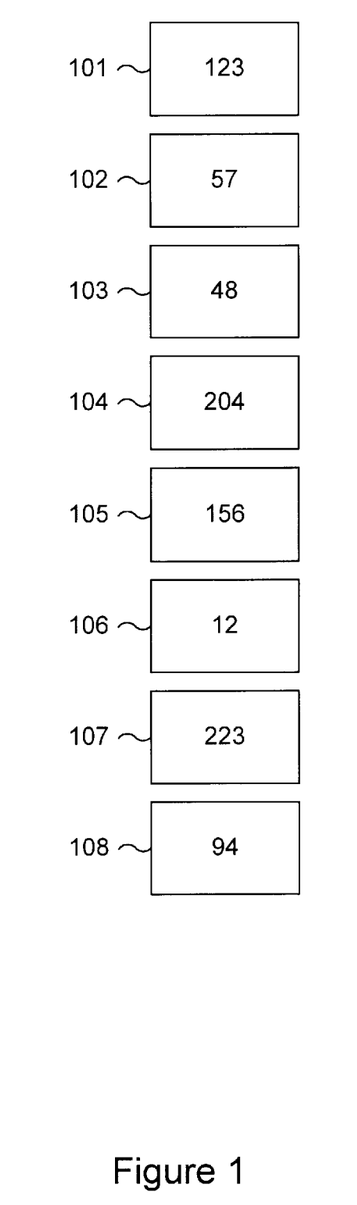
FIG. 1 is a diagram illustrating eight memory registers storing eight different values.

FIG. 1 is a diagram illustrating eight memory registers 101–108 in which eight different values are stored. A number of methods are known for searching through the stored memory values to determine, for example, a minimum value. The registers may be searched sequentially until it is determined that the value 12 stored in memory register 106 is the minimum value.

One method is to compare the first register to the second and then compare the lesser or those two registers to the third and the lesser or that comparison to the fourth and so on. This method requires N−1 clock cycles to complete assuming one comparison is performed per clock cycle (If a comparison takes more than a clock cycle, then (N−1) would be multiplied by the appropriate number of cycles). This method is slow for large data sets and an improved method can be envisioned in which the cells are divided into pairs and each register of each pair is compared with another register in the pair with the lesser values from each pair being noted and paired again for comparison during a subsequent clock cycle. This parallel method would take fewer clock cycles than the first described method ($\log_2 N$ cycles compared to N−1 cycles), but would still require multiple cycles to derive the minimum stored value.

In certain applications, quickly determining a minimum stored value from among a group of values is important, and it would be desirable to determine such a minimum value within fewer clock cycles, and ideally, within a single clock cycle.

SUMMARY OF THE INVENTION

A memory cell array configured to determine the minimum or maximum value stored in a set of registers within the array is disclosed. The memory cell array compares the values stored in each of its registers and outputs the minimum or maximum value on a set of common indicator lines. In addition, each register has an output that indicates whether the register is a register that stores the minimum value. The comparison is made in parallel and can be made more quickly than a comparison made by sequentially accessing memory registers and computing sequential comparisons.

It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

In one embodiment, a memory cell having a memory cell state comprises a memory unit configured to store a bit of data wherein the bit of data determines whether the memory cell state is a first state or a second state and a common state indicator line configured to indicate a common state associated with a group of memory cells. The memory cell further includes a logic circuit configured to compare the memory cell state to the common state, and an output line configured to indicate the result of the comparison.

In another embodiment, a memory cell array having a plurality of memory cells having memory cell states and organized into subsets of memory cells having weights comprises a plurality of common state indicator lines configured to indicate a common state among individual memory cells in different subsets of memory cells. The individual memory cells associated with each common state indicator line have the same assigned weight within their respective subsets of memory cells. Each memory cell is configured to compare the memory cell state to the state indicated on a common state indicator line associated with the memory cell and each cell is configured to be enabled or disenabled by an enable line. Each memory cell is further configured to output a signal indicating the result of the comparison when the memory cell is enabled.

A method of identifying one or more value elements in a set of elements having value is disclosed. The method comprises storing the values in a memory cell array having a plurality of sets of memory cells, each value being stored in a set of memory cells. The stored values are compared to a set of common state indicator lines configured to indicate the minimum value stored in the memory cell array. The method further comprises noting which sets of memory cells store the minimum value.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

A detailed description of a preferred embodiment of the invention is provided below. While the invention is described in conjunction with that preferred embodiment, it should be understood that the invention is not limited to any one embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, details relating to technical material that is known in the technical fields related to the invention has not been described in detail in order not to unnecessarily obscure the present invention in such detail.

The disclosed memory cell array is particularly useful for determining a minimum value in applications that process events using an event queue. For example, a network device may receive a large number of packets which must be queued for processing or forwarding. In some applications, packets may each include a time constraint that determines a deadline before which the packet must be processed. For example, packets containing audio data played in real time may need to be processed within a certain latency constraint to prevent gaps in playback. It may be necessary to sort the deadlines, to determine when the next deadline will occur, and to determine which packet or packets correspond to the next deadline so that such packets may be processed next.

Figure 2:
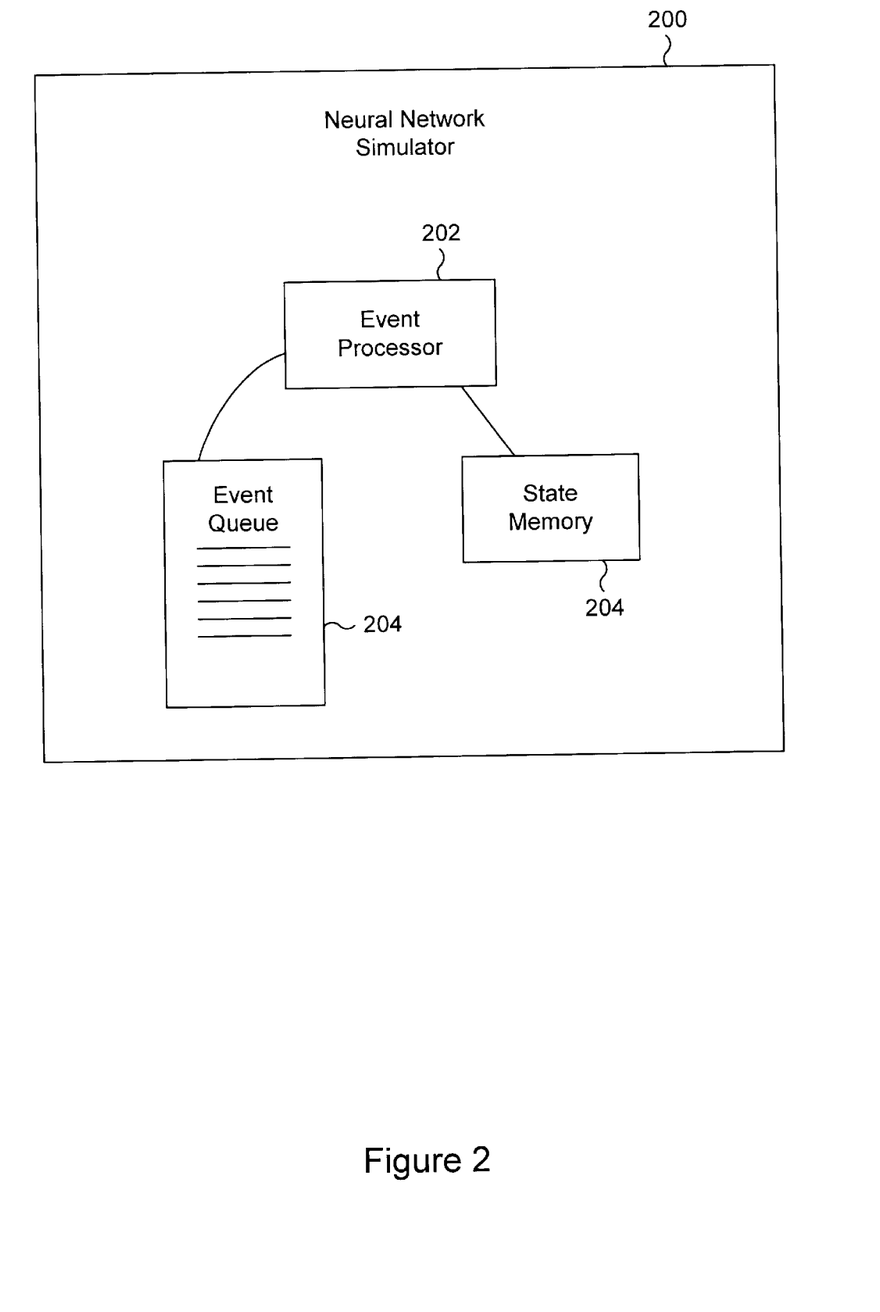
FIG. 2 is a block diagram illustrating a neural network simulator.

Many other applications exist in which an event queue or other type of list must be sorted to determine the member of the list that has a minimum value and/or to determine what the minimum value is. An application that particularly requires repeated sorting of stored values to determine a minimum value is a neural network simulator that generates and processes events using an event queue. FIG. 2 is a block diagram illustrating neural network simulator 200.

Neural network simulator 200 simulates a neural network and processes data using simulated elements of the network which may be referred to as "neurons". The neurons finction by determining when other neurons connected to them have fired (an event) and by firing themselves, generating subsequent events that must be processed by neurons that are connected to the firing neuron.

Neural net simulator 200 includes an event processor 202 that processes successive events that occur at the neurons and a state memory 206 that keeps track of the state of each of the neurons. Event processor 202 is connected to an event queue 204 that continually sorts the various events generated by the neurons and provides the next event to be processed by the event processor in a timely fashion. The next event may be determined in the event processor by determining a minimum stored time value or a maximum stored time value, depending on a specific convention that may be chosen.

A neural network simulator that simulates a large number of neurons must continually generate and process a very large number of events. Because new events are continually being generated at different points in time relative to other events, an event queue that selects the next event to be processed must continually be resorted. The memory cell array disclosed herein is used to quickly determine the next event in the event queue without requiring sequential sorting of the queue.

Figure 3A:
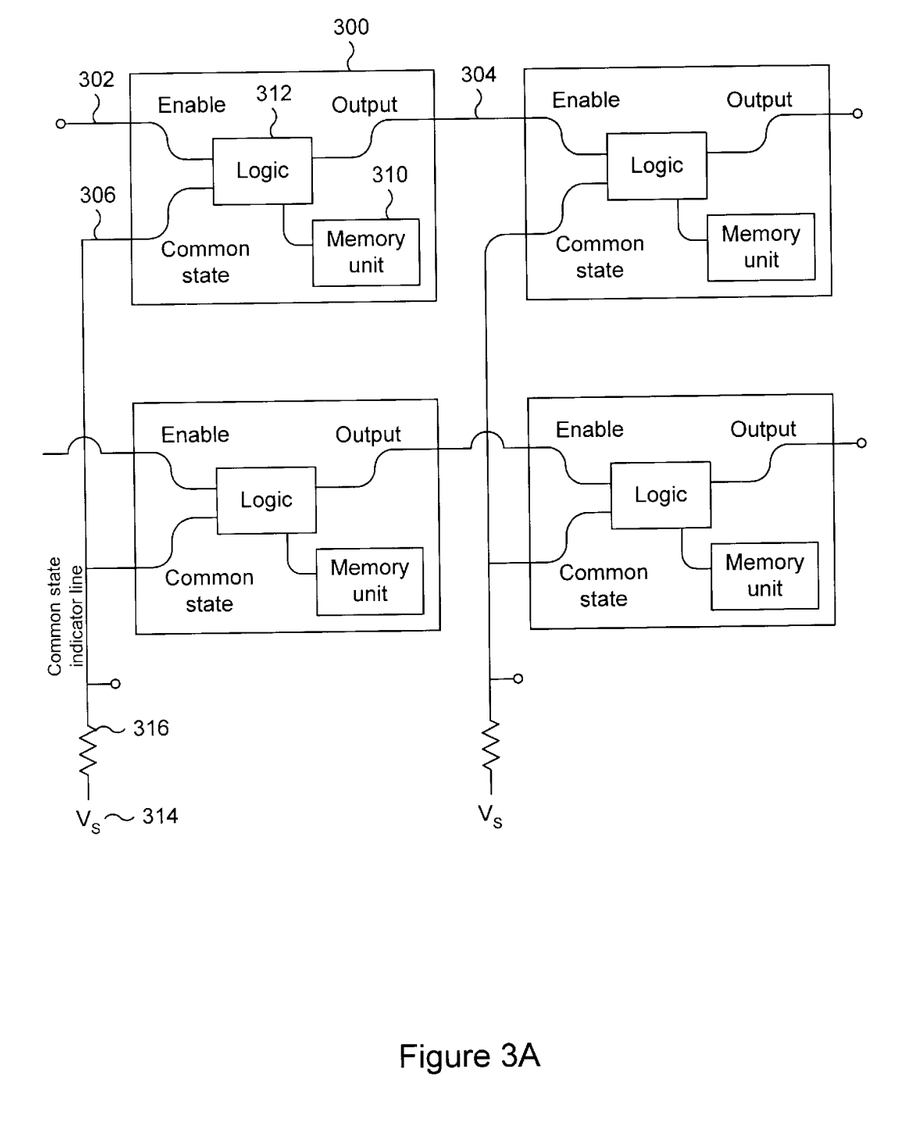
FIG. 3A is a block diagram illustrating a portion of a memory cell array.

FIG. 3A is a block diagram illustrating a portion of a memory cell array that automatically returns the minimum value stored in the array and indicates the element of the array that stores the minimum value. For the purpose of this description, a memory cell refers to an individual element of the array and a memory register refers to a group of memory cells that store a value. Also, for the purpose of clarity, each memory cell is described as storing a single bit. In other embodiments, memory cells may individually store more information.

In the array illustrated, each memory register corresponds to a row in the memory cell array and each column of cells corresponds to equally significant bits within their respective rows. It should be noted that numerous other configurations and arrangements of memory cells may be used that still maintain the required relationships among cells described herein. The disclosed invention is not intended to be limited to memory cell arrays which are organized in the row and column format depicted. Also, it should be noted that various potentials are described as being high or low in the memory cell access circuits described herein. Of course, alternate circuit designs could be used in which such potentials are reversed or reconfigured. It should also be noted that, whenever a minimum or maximum is referred to in the following description, appropriate changes in the logic described may be made to change the calculation from the minimum to the maximum or vice versa.

The memory cell array includes a memory cell 300. Memory cell 300 includes an input enable line 302 and an output line 304. Memory cell 300 is also connected to a common state indicator line 306. Memory cell 300 reads a state from common cell indicator line 306 and, in certain circumstances, may change the state of the common state indicator line. The output of memory cell 300 on output line 304 is connected to the enable input of the next memory cell in the same row that includes memory cell 300. The next memory cell corresponds to the next most significant bit that is included in the set of memory cells that together store a value. The set of memory cells in one embodiment is an entire row of memory cells in an array and may be referred to as a word, a register, or simply as a set of memory cells.

The various inputs and outputs of memory cell 300 are connected to a logic circuit 312 that processes or generates the state of the lines. In addition, logic circuit 312 is also connected to a memory unit 310 that stores data in the cell. In one embodiment, a single bit of data is stored in memory unit 310. Memory unit 310 may be any type of memory circuit that stores data to be read by logic circuit 312. For example, memory unit 310 may be an DRAM, SRAM, or some form of non-volatile memory such as an EEPROM.

Logic circuit 312 generates an output on line 304 as a result of the state of the bit stored in memory unit 310 and the state of enable line 302 and common state indicator line 306. In addition, logic circuit 312 may selectively change the state of the common state indicator line 306 when the memory cell is enabled depending on the data stored in memory unit 310. It will now be described how the minimum function is implemented among rows in the memory cell array.

In one embodiment, common state indicator line 306 is weakly pulled up to a high potential. This may be accomplished by using a voltage source 314 and a current limiting resistor 316. Other well known methods for providing a weak pull up voltage include using a PFET transistor. Common state indicator line 306 tends to float high so long as it is not connected to a hard ground. The logic circuit 312 contained in each of the memory cells 300 selectively attaches the common state indicator line 306 to a hard ground when the memory cell is enabled and the value stored in memory unit 310 is low. Thus, common state indicator line 306 is pulled to ground whenever any of the memory cells is enabled and stores a low value. If common state indicator line 306 is low, then one of the memory cells connected to the common state indicator line is enabled and stores a low value.

In the example shown, each column of memory cells 300 includes cells that store an equally significant bit for each of their respective rows. The common state indicator line 306 indicates the minimum value stored in the column by an enabled cell. Only enabled cells can possibly be cells in a row that stores the minimum value. If a cell is high and the common state indicator line 306 is pulled low by another cell then the output of that cell is driven low. The low output from one cell is propagated down the row to all memory cells of lesser significance through the enable input lines. The low output of one cell is connected to the enable input of the next most significant memory cell, causing the next most significant cell to be disenabled and causing its output to be low and disenabling the next most significant cell, etc.

Thus, once a cell in a row is determined to have a higher value than another cell in a column, of equally significant bits, that cell outputs a low output which causes all of the remaining cells in the same row which are less significant cells to be disenabled and their outputs driven low. When a cell is disenabled, it does not affect the common state indicator line 306 for its column and its output is driven low. Thus, only cells that are eligible to be in a row that stores the minimum value may affect the common state indicator line for a given column. The left-most column of cells represent the most significant cells in each row and are all enabled. Any such cell which stores a zero pulls the common state indicator line 306 to ground and causes any cell that stores a high value in the same column to output a low signal.

The minimum value stored may be read from each of the common indicator lines 306 since each common indicator line is pulled to ground by the cells that store low bits in the row or rows that store the minimum value. The row or rows which contain the minimum value may be determined by the state of the output of the right-most cells in each of the rows. It should be noted that more than one row may contain the minimum value and in such a case, each such minimum value row has a high output at its right most cell.

It should be noted that other circuitry may be connected to memory unit 310 for the purpose of reading the value and memory unit. Additional circuitry that is not shown is connected to the memory unit for the purpose of storing data in the memory unit. In the embodiment shown, the memory unit stores one bit of data and the bits corresponding to the minimum value stored may be directly read from the common indicator lines 306 for the columns of the array.

Figure 3B:
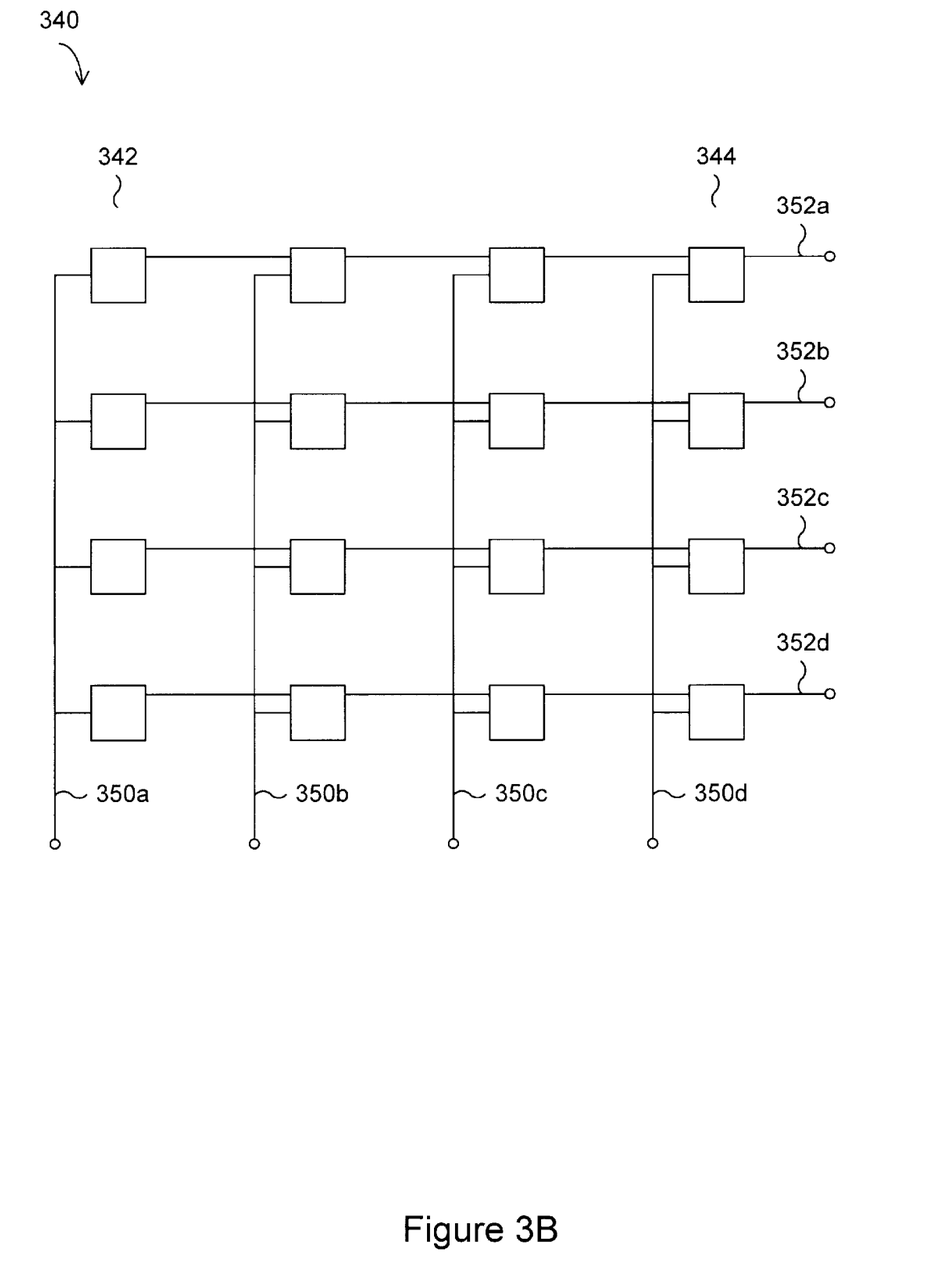
FIG. 3B is a block diagram illustrating a memory cell array having four rows and four columns.

FIG. 3B is a block diagram illustrating a memory cell array that includes four rows and four columns. Each row is a four bit register and the array is configured to determine the minimum value stored in the registers. Column 342, the left-most column, represents the most significant bit of each of the registers and column 344, the right-most column, represents the least significant bit of each of the registers. Each bit has an output connected to the input of the next most significant bit as shown in FIG. 3A and the columns include common state indicator lines, 350a through 350d that connect equally significant bits.

Each memory cell is configured as shown in FIG. 3A so that when any memory cell is enabled and low in a column, the common state indicator line for that column is driven low. In addition, the output of each cell is configured to indicate that the row is still eligible to be the minimum register when that is the case. The minimum value stored in the memory cell array may be read by reading lines 350a, 350b, 350c and 350d. The register or registers that store the minimum value can be determined by checking the output of the least significant bit of each register or row at 352a, 352b, 352c and 352d. Larger memory cells may similarly be configured and, in some large arrays, rows may be split to include more than one register.

Figure 4:
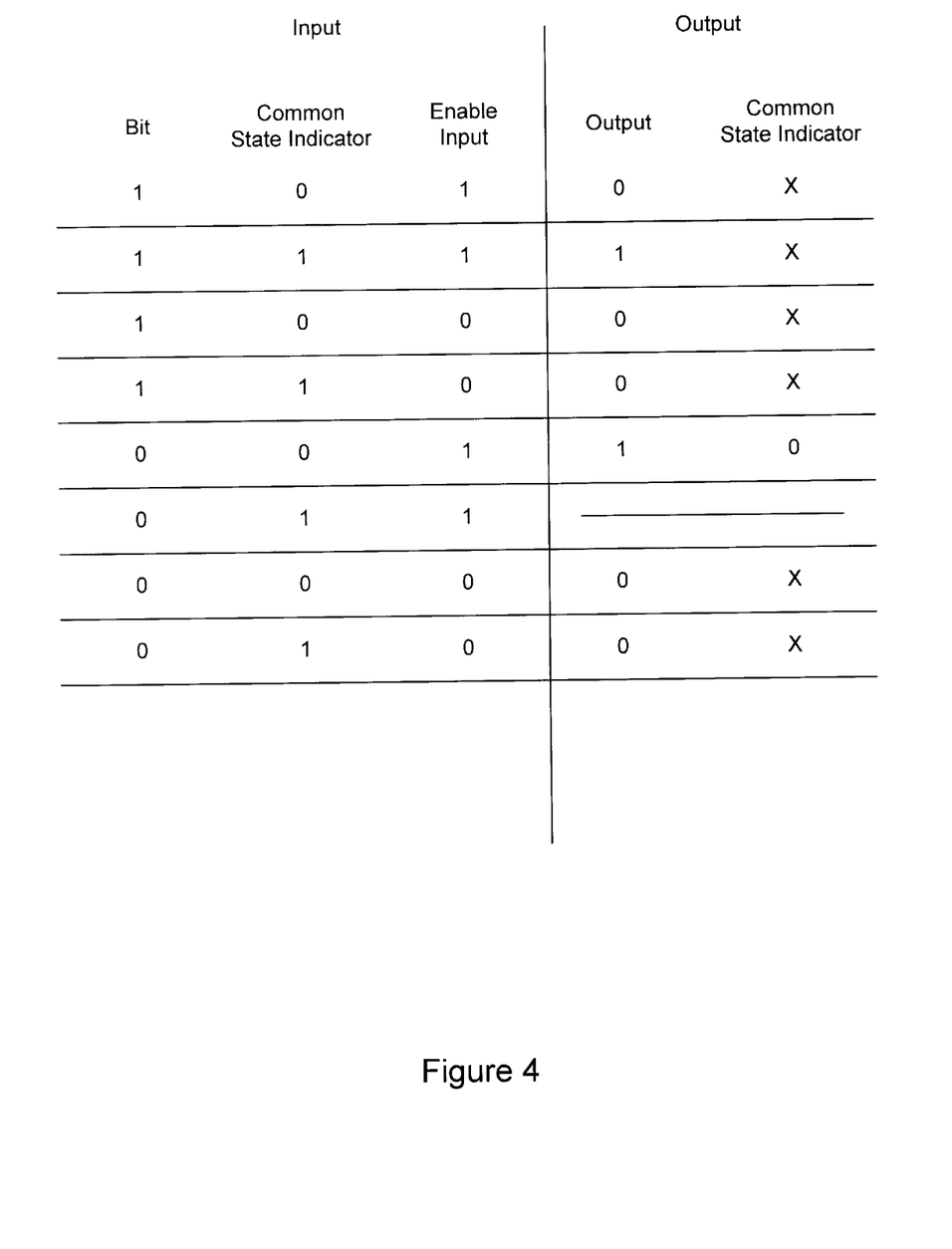
FIG. 4 is a truth table illustrating how a logic circuit implements a minimum comparison function.

FIG. 4 is a truth table illustrating how a logic circuit such as logic circuit 312 implements a minimum comparison function. When the bit stored in the memory unit 310 is high, the common state indicator line 306 is unaffected (indicated by an X in the table). When the bit stored in the memory unit 310 is low, then the common state indicator line 306 is driven to a low potential if the memory cell enable input is high. The output of the memory cell is high when the input is enabled and the bit is low or when the input is enabled, the bit is high and the common state indicator line 306 is also high.

The common state indicator line 306 is shown in the truth table as both an input and an output since the memory cell may change the state of the common state indicator line in certain cases and the state of the common state indicator line also affects the action performed by the memory cell 300. The combination of inputs where the enable input is high, the bit is low, and the common state indicator is high is not possible because the memory cell drives the common state indicator low when the enable input is high and the bit is low.

Figure 5A:
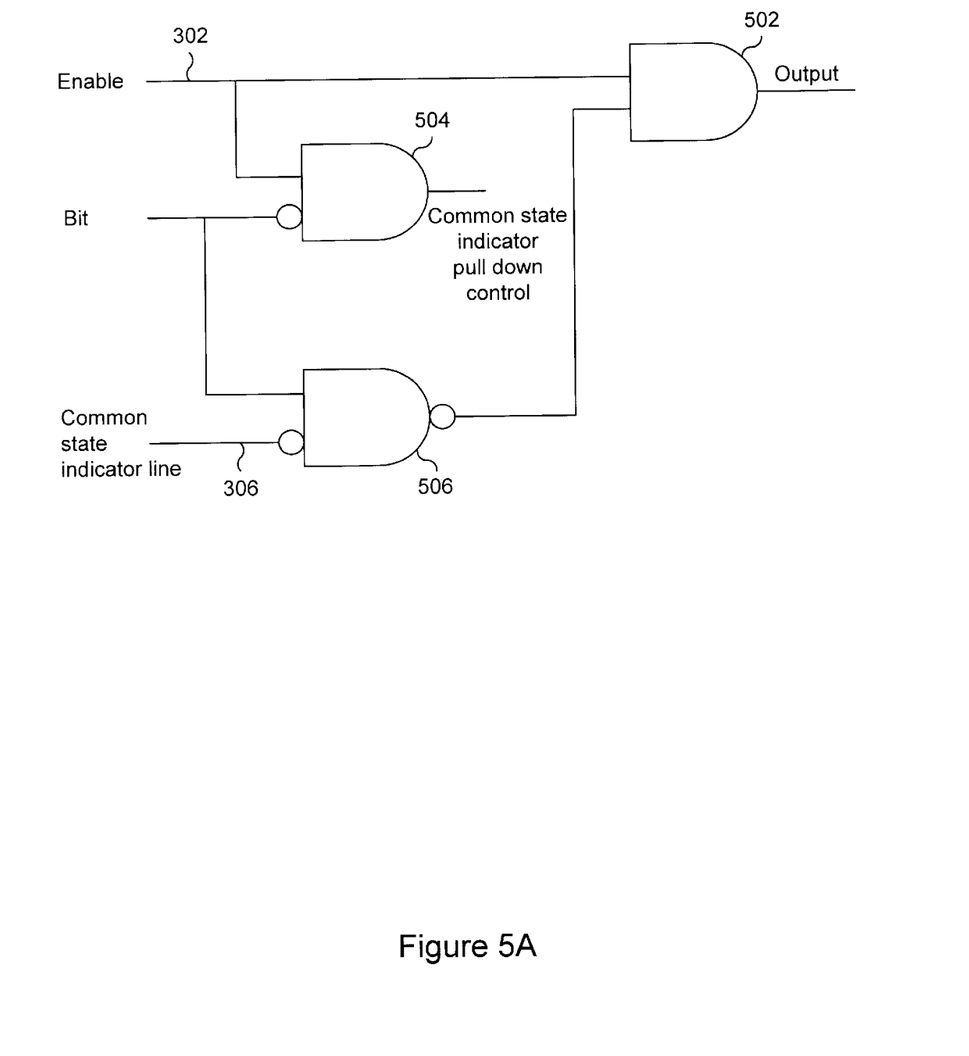
FIG. 5A is a diagram illustrating a logic circuit.

FIG. 5A is a diagram illustrating one logic circuit that may be used for logic circuit 312. The enable input line 302 is input to a pair of AND gates 502 and 504. The bit from the memory unit 310 is inverted and input to AND gate 504. The output of AND gate 504 is used to control the common state indicator line pulldown so that when AND gate 504 outputs a one, the pulldown circuit is connected to the common state indicator line. The pulldown circuit changes the common state indicator line from a default state (high potential) to an indicating state (grounded). The bit from the memory unit 310 is also input to AND gate 506 along with an inverted common state indicator line. The output of AND gate 506 is inverted and input to AND gate 502. The output of AND gate 502 is the output of the memory cell which for cells other than the least significant cell is input to the next lesser significant cell in the array. For the least significant cell, the output is used to indicate whether the row to which the cell belongs stores the minimum value. Thus, the logic circuit 312 can be implemented in a straightforward manner to provide the desired output and common state indicator pulldown control signals. Of course, many different circuits can be used to implement this logic in a straightforward manner. It should be noted that the logic described is for a memory cell array that determines the minimum value stored. It should also be noted that the logic shown is used to enable a common state indicator pulldown control. In other embodiments, the common state indicator line may be pulled up to indicate the presence of a certain value in a memory cell.

Figure 5B:
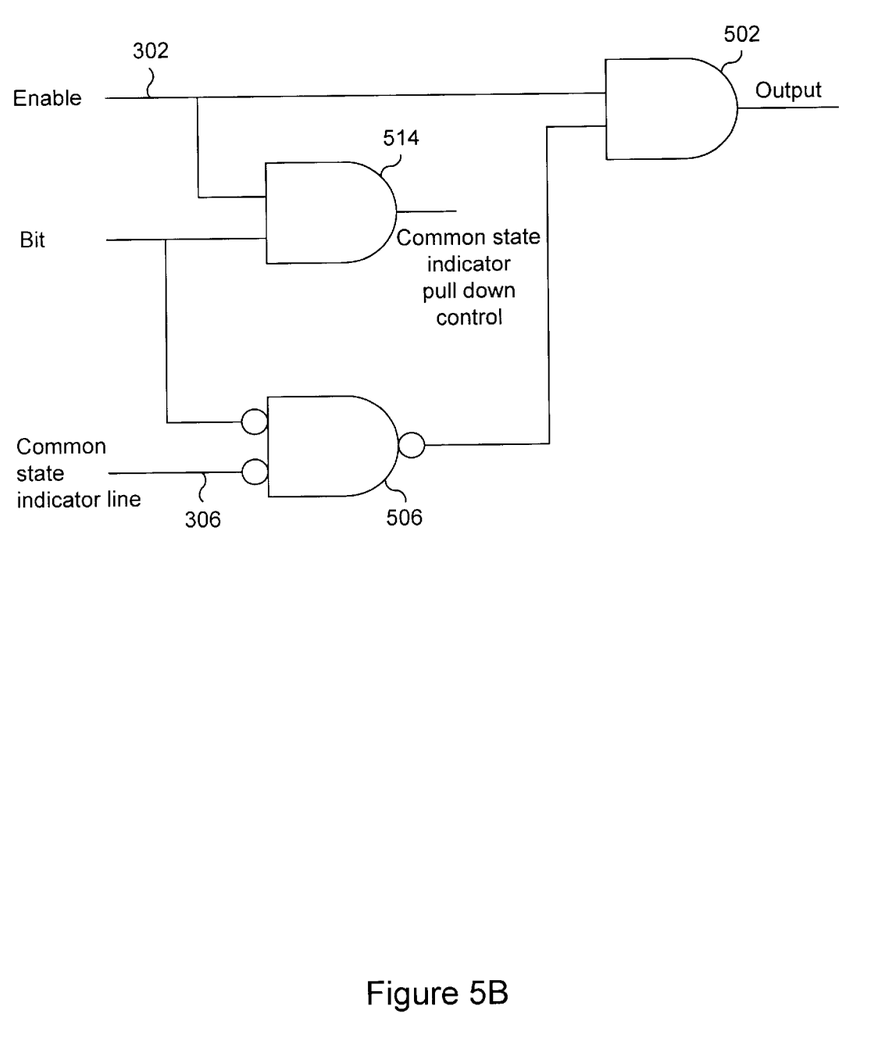
FIG. 5B is a diagram illustrating a second embodiment of a logic circuit.

Determination of a maximum value stored is accomplished in the same manner using complimentary signals where appropriate. FIG. 5B is a diagram illustrating a logic circuit implemented in a memory array that determines the maximum value stored in the array instead of the minimum value stored. The circuit is similar to the circuit shown in FIG. 5A except that the bit from the memory cell that is input to AND gate 514 is not inverted and the bit input to AND gate 506 is inverted. As a result, the common state indicator pull down control line is only activated when the bit is high and the enable input is high. Likewise, the output is high when the enable input is high and either the common state indicator line is high or the bit is high.

Figure 6A:
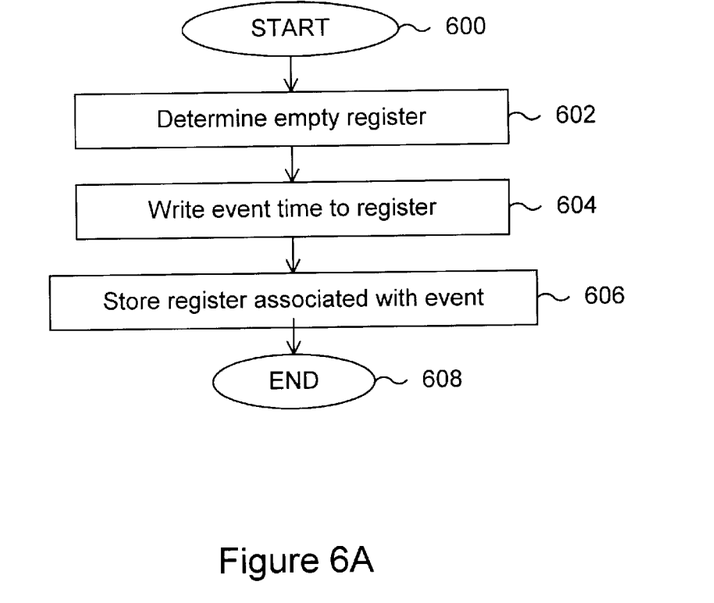
FIG. 6A is a flowchart illustrating a process for storing an event in a memory cell array event queue.

As mentioned above, one application of the disclosed memory cell array is to store an event queue and return the next event or events in the queue along with a time associated with those events. FIG. 6A is a flowchart illustrating a process for storing an event in a memory cell array event queue. The process starts at 600. In a step 602, an empty register in the memory cell array is determined for storing the time associated with the new event that is to be stored in the queue. Next, in a step 604, the event time is written to the register. In a step 606, the register associated with the event is noted so that when that register is determined by the memory cell array to be the register with the lowest time stored, the event associated with that register may be retrieved. The process ends at 608. Thus, an event time may be written into the memory cell array, and the event associated with that time is associated with the register in the array in which the time is stored.

Figure 6B:
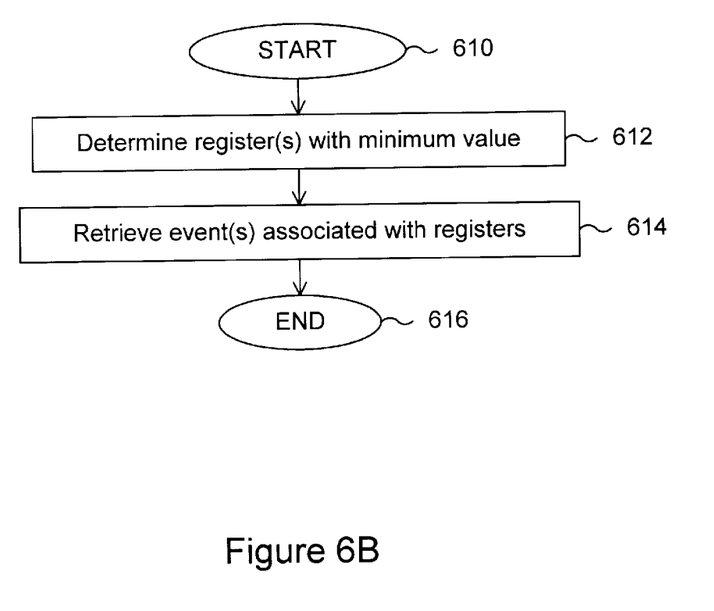
FIG. 6B is a flowchart illustrating a process for retrieving a next event from an event queue.

FIG. 6B is a flowchart illustrating a process for retrieving the next event from the event queue. The process starts at 610. In a step 612, the register with a minimum value is determined by the memory cell array. Next, in a step 614, the event associated with that register is retrieved. If more than one register stores the minimum time value, then multiple events may be retrieved in step 614. The events can then be processed by a processor that handles events and the process ends at 616. The process may be repeated any time that the next event is to be retrieved from the event queue. When an event is retrieved from the queue for processing, the event may be automatically erased from the queue. In one embodiment, empty registers in the memory cell array are kept track of in a table so that new events may be stored to those registers. In another embodiment, a specific value is stored in empty registers that is a value that cannot correspond to a legal time and empty registers are found by looking for a register with the specific value that indicates that the register is empty.

A memory cell array that returns the minimum or maximum value stored in the array has been disclosed. The array indicates which register or registers in the array is associated with the minimum value as well as returning the minimum value. Such an array is useful for implementing an event queue that automatically returns the next event in the queue to be processed.

In other embodiments, the logic circuit is adapted to handle other changes such as when the common state indicator line floats low and is pulled high by a cell that stores a certain valued bit. Such modifications of the logic circuit to handle such variations may be implemented in a straightforward manner.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A memory cell having a memory cell state comprising:
   a memory unit configured to store a bit of data wherein the bit of data determines whether the memory cell state is a first state or a second state;
   a common state indicator line configured to indicate a common state associated with a group of memory cells, remain in a default state and transition to an indicating state when at least one memory cell in the group of memory cells is in its second state;
   a logic circuit configured to compare the memory cell state to the common state; and
   an output line configured to indicate the result of the comparison.

2. A memory cell as recited in claim 1 wherein the common state indicator line is configured to float at a high potential indicating the default state and wherein the indicating state is output to the common state indicator line by grounding the common state indicator line.

3. A memory cell having a memory cell state comprising:
   a memory unit configured to store a bit of data wherein the bit of data determines whether the memory cell state is a first state or a second state;
   a common state indicator line configured to indicate a common state associated with a group of memory cells;
   a logic circuit configured to compare the memory cell state to the common state; and
   an output line configured to indicate the result of the comparison and connected to an enable line of a second memory cell.

4. A memory cell having a memory cell state comprising:
   a memory unit configured to store a bit of data wherein the bit of data determines whether the memory cell state is a first state or a second state;
   a common state indicator line configured to indicate a common state associated with a group of memory cells;
   a logic circuit configured to compare the memory cell state to the common state;
   an output line configured to indicate the result of the comparison; and an enable line that is connected to an output line of a second memory cell.

5. A memory cell array having a plurality of memory cells having memory cell states and organized into subsets of memory cells having weights comprising:
   a plurality of common state indicator lines configured to indicate a common state among individual memory cells in different subsets of memory cells, wherein the individual memory cells associated with each common state indicator line have the same assigned weight within their respective subsets of memory cells;
   wherein each memory cell is configured to compare the memory cell state to the state indicated on a common state indicator line associated with the memory cell;
   wherein each memory cell is configured to be enabled or disenabled by an enable line;
   wherein each memory cell is configured to output a signal indicating the result of the comparison when the memory cell is enabled; and
   wherein the output signals of each of the memory cells except the lowest weight memory cells are used to enable or disenable a memory cell in the same subset of memory cells having the next lowest weight.

6. A memory cell array as recited in claim 5 wherein the output signals of the lowest weight memory cell in each subset of memory cells is used to indicate a comparison result for the subset of memory cells.

7. A memory cell array having a plurality of memory cells having memory cell states and organized into subsets of memory cells having weights comprising:

a plurality of common state indicator lines configured to indicate a common state among individual memory cells in different subsets of memory cells, wherein the individual memory cells associated with each common state indicator line have the same assigned weight within their respective subsets of memory cells;

wherein each memory cell is configured to compare the memory cell state to the state indicated on a common state indicator line associated with the memory cell;

wherein each memory cell is configured to be enabled or disenabled by an enable line;

wherein each memory cell is configured to output a signal indicating the result of the comparison when the memory cell is enabled; and wherein the common state indicator line is configured to float at a high potential indicating a default state and wherein an indicating state is output to the common state indicator line by grounding the common state indicator line.

8. A memory cell array having a plurality of memory cells having memory cell states and organized into subsets of memory cells having weights comprising:

a plurality of common state indicator lines configured to indicate a common state among individual memory cells in different subsets of memory cells, wherein the individual memory cells associated with each common state indicator line have the same assigned weight within their respective subsets of memory cells;

wherein each memory cell is configured to compare the memory cell state to the state indicated on a common state indicator line associated with the memory cell;

wherein each memory cell is configured to be enabled or disenabled by an enable line;

wherein each memory cell is configured to output a signal indicating the result of the comparison when the memory cell is enabled; and wherein the common state indicator line is configured to remain in a default state until one of the memory cells associated with the common state indicator lines outputs an indicating state to the common state indicator line.

9. A memory cell array having a plurality of memory cells having memory cell states and organized into subsets of memory cells having weights comprising:

a plurality of common state indicator lines configured to indicate a common state among individual memory cells in different subsets of memory cells, wherein the individual memory cells associated with each common state indicator line have the same assigned weight within their respective subsets of memory cells;

wherein each memory cell is configured to compare the memory cell state to the state indicated on a common state indicator line associated with the memory cell;

wherein each memory cell is configured to be enabled or disenabled by an enable line;

wherein each memory cell is configured to output a signal indicating the result of the comparison when the memory cell is enabled; and wherein each common state indicator line is configured to remain in a default state until one of the memory cells associated with the common state indicator lines outputs an indicating state to the common state indicator line and wherein the state of each common state indicator line is used to determine whether any of the memory cells associated with the common state indicator line is in the second state.

10. A memory cell array having a plurality of memory cells having memory cell states and organized into subsets of memory cells having weights comprising:

a plurality of common state indicator lines configured to indicate a common state among individual memory cells in different subsets of memory cells, wherein the individual memory cells associated with each common state indicator line have the same assigned weight within their respective subsets of memory cells;

wherein each memory cell is configured to compare the memory cell state to the state indicated on a common state indicator line associated with the memory cell;

wherein each memory cell is configured to be enabled or disenabled by an enable line;

wherein each memory cell is configured to output a signal indicating the result of the comparison when the memory cell is enabled; and wherein the output signals are used to determine the subset of memory cells that corresponds to a minimum value.

11. A memory cell array as recited in claim 8 wherein the states of the common state indicator lines are used to determine a minimum value.

12. A memory cell array as recited in claim 8 wherein the states of the common state indicator lines are used to determine a maximum value.

13. A memory cell array as recited in claim 10 wherein the subsets are rows of memory cells.

14. A memory cell array as recited in claim 10 wherein the subsets are memory words.

15. A memory cell array having a plurality of memory cells having a high state and a low state and organized into subsets of memory cells having weights comprising:

a plurality of common state indicator lines for each of the memory cell weights configured to indicate whether at least one memory cell having the corresponding weight is in the low state;

wherein the memory cells in each subset are configured to disenable any lesser weight memory cells in the same subset when the common state indicator line is low and the memory cell state is high; and wherein the lowest weight memory cells in each subset of memory cells are configured to indicate whether the aggregate state of the subset of memory cells is the lowest aggregate state among all of the subsets of memory cells.

16. A memory cell array as recited in claim 15 wherein the common state indicator lines indicate the minimum value stored in the memory cell array.

17. A memory cell array having a plurality of memory cells having a high state and a low state and organized into subsets of memory cells having weights comprising:

a plurality of common state indicator lines for each of the memory cell weights configured to indicate whether at least one memory cell having the corresponding weight is in the high state;

wherein the memory cells in each subset are configured to disenable any lesser weight memory cells in the same subset when the common state indicator line is high and the memory cell state is low; and wherein the weight memory cells in each subset of memory cells are configured to indicate whether the aggregate state of the subset of memory cells is the highest aggregate state among all of the subsets of memory cells.

18. A memory cell array as recited in claim 14 wherein the common state indicator lines indicate the maximum value stored in the memory cell array.

19. An event queue including a plurality of events having associated times stored in sets of memory cells included in a memory cell array wherein the memory cell array includes a plurality of common state indicator lines configured to indicate the minimum time stored in a set of memory cells; and wherein each set of memory cells is configured to compare the time stored in the set of memory cells to the minimum time value and to indicate whether the event associated with the set of memory cells is the first event in the event queue.

\* \* \* \* \*